United States Patent
Jeong

(10) Patent No.: US 9,922,710 B1
(45) Date of Patent: Mar. 20, 2018

(54) RESISTANCE VARIABLE MEMORY APPARATUS AND READ CIRCUIT AND METHOD THEREFOR

(71) Applicant: SK hynix Inc., Icheon-si Gyeonggi-do (KR)

(72) Inventor: Sang Hoon Jeong, Yeoju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/608,301

(22) Filed: May 30, 2017

(30) Foreign Application Priority Data

Nov. 18, 2016 (KR) .................. 10-2016-0153873

(51) Int. Cl.
*G11C 11/00* (2006.01)
*G11C 13/00* (2006.01)
*G11C 7/16* (2006.01)

(52) U.S. Cl.
CPC .............. *G11C 13/004* (2013.01); *G11C 7/16* (2013.01); *G11C 2013/0042* (2013.01); *G11C 2013/0054* (2013.01)

(58) Field of Classification Search
CPC . G11C 13/004; G11C 7/16; G11C 2013/0042; G11C 2013/0054

USPC ........................................................ 365/148
See application file for complete search history.

(56) References Cited

U.S. PATENT DOCUMENTS 7,269,080 B2 9/2007 Bedeschi et al.
8,760,908 B2 * 6/2014 Kunitake ........... G11C 13/0004
365/148
9,361,976 B2 * 6/2016 Siau ....................... G11C 7/067

FOREIGN PATENT DOCUMENTS

KR 1020110059124 A 6/2011

* cited by examiner

*Primary Examiner* — Fernando Hidalgo
(74) *Attorney, Agent, or Firm* — William Park & Associates Ltd.

(57) ABSTRACT

A resistance variable memory apparatus in accordance with an embodiment may include a memory cell array and a read circuit. The memory cell array may include a plurality of resistance variable memory cells coupled between a plurality of word lines and a plurality of bit lines. The read circuit may couple a word line, to which a selected resistance variable memory cell is coupled, to a first ground voltage supply terminal for a preset first time period before an amount of current flowing through the selected resistance variable memory cell is detected. The read circuit may couple a bit line, to which the selected resistance variable memory cell is coupled, to a power voltage supply terminal for a preset second time period, in a read operation.

20 Claims, 8 Drawing Sheets

RESISTANCE VARIABLE MEMORY APPARATUS AND READ CIRCUIT AND METHOD THEREFOR

CROSS-REFERENCES TO RELATED APPLICATION

The present application claims priority under 35 U.S.C. § 119(a) to Korean application number 10-2016-0153873 filed on Nov. 18, 2016, in the Korean Intellectual Property Office, which is incorporated herein by reference in its entirety.

BACKGROUND

1. Technical Field

Various embodiments generally relate to a semiconductor integrated circuit, and more particularly to a resistance variable memory apparatus and a read circuit thereof.

2. Related Art

Recently a resistance variable memory apparatus has been recognized as a next-generation memory apparatus with the potential to achieve a goal of providing consumers with a low-cost, high-speed, low-power-consumption nonvolatile random access memory.

The resistance variable memory apparatus may include a pair of electrodes having a data storage material layer received therebetween. The resistance variable memory apparatus can be electrically switched between logic high and logic low states by changing the resistance state of the data storage material layer.

A phase-change random access memory (PRAM), which is one of the examples of the resistance variable memory apparatus, may include an access element and a data storage material layer configured of a phase-change material. When a preset voltage is applied between a word line and a bit line to write (program) data in the PRAM, a write current may be applied to the data storage material layer to change a resistance state of the data storage material layer.

A voltage sensing method, a current sensing method, and the like may be used to read data stored in a PRAM.

When the data is read by using a current sensing method, a logic level of the data bit may be determined based on an amount of current flowing through a memory cell turned on by a potential difference between both terminals of the memory cell.

The read operation speed and read margin may serve as factors that determine performance of the resistance variable memory apparatuses.

SUMMARY

In an embodiment of the present disclosure, a resistance variable memory apparatus may include a memory cell array and a read circuit. The memory cell array may include a plurality of resistance variable memory cells coupled between a plurality of word lines and a plurality of bit lines. The read circuit may couple a word line, to which a selected resistance variable memory cell is coupled, to a first ground voltage supply terminal for a preset first time period before an amount of current flowing through the selected resistance variable memory cell is detected. The read circuit may couple a bit line, to which the selected resistance variable memory cell is coupled, to a power voltage supply terminal for a preset second time period, in a read operation.

In an embodiment of the present disclosure, a read circuit for a resistance variable memory apparatus may include a read unit. The read unit may couple a word line, to which a selected resistance variable memory cell is coupled, to a first ground voltage supply terminal for a preset first time period before an amount of current flowing through the selected resistance variable memory cell is detected. The read unit may couple a bit line, to which the selected resistance variable memory cell is coupled, to a power voltage supply terminal for a preset second time period, in a read operation.

In an embodiment of the present disclosure, a read method for a resistance variable memory apparatus may include coupling a word line, to which a selected resistance variable memory cell is coupled, to a first ground voltage supply terminal for a preset first time period in response to a read command. The read method may include coupling a bit line, to which the selected resistance variable memory cell is coupled, to a power voltage supply terminal for a preset second time period. The read method may include detecting an amount of current flowing through the selected resistance variable memory cell.

These and other features, aspects, and embodiments are described below in the section entitled "DETAILED DESCRIPTION"

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
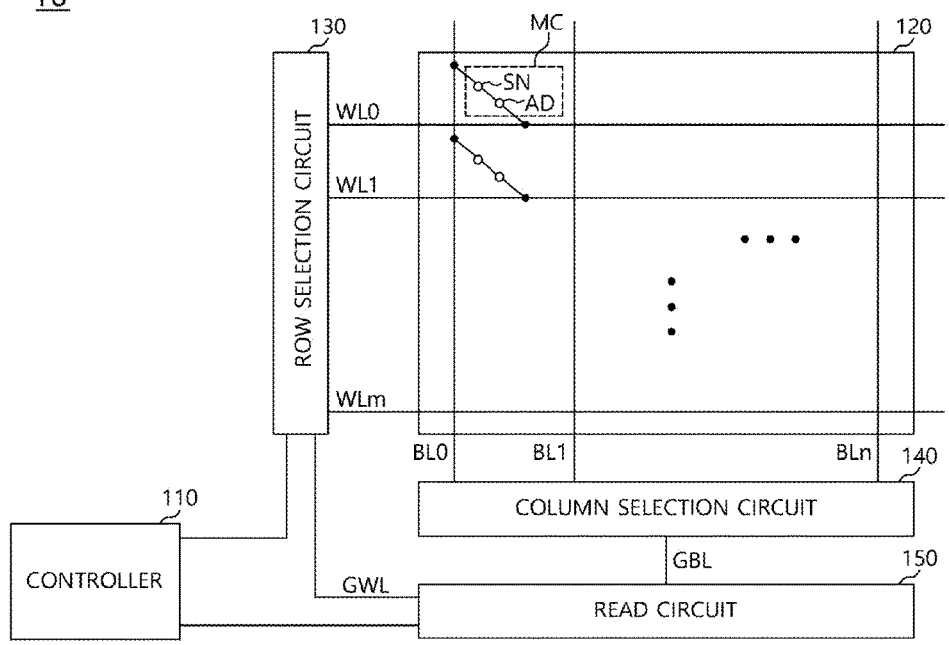
FIG. 1 is a configuration diagram illustrating an example of a resistance variable memory apparatus according to an embodiment of the present disclosure.

FIG. 1 is a configuration diagram illustrating an example of a resistance variable memory apparatus according to an embodiment.

Referring to FIG. 1, a resistance variable memory apparatus 10 according to an embodiment may include a controller 110, a memory cell array 120, a row selection circuit 130, a column selection circuit 140, and a read circuit 150.

A controller 110 may allow data to be written in the memory cell array 120 in response to a write command input from an external apparatus or a host. The controller 110 may allow data to be read from the memory cell array 120 in response to a read command input from the external apparatus or the host.

The memory cell array 120 may include a plurality of resistance variable memory cells MC coupled between a plurality of word lines WL0 to WLm and a plurality of bit lines BL0 to BLn.

The resistance variable memory cell MC may be, for example, a PRAM cell. In an embodiment, the resistance variable memory cell MC may include a data storage node SN and an access element AD coupled between a word line WL and a bit line BL.

In an embodiment, the data storage node SN may contain a phase-change material. The access element AD may be selected from switching elements such as a diode, a horizontal transistor, a vertical transistor, and an ovonic threshold switching (OTS) element, but the access element is not limited thereto.

In an embodiment, the memory cell array 120 may have a cross-point array structure. The cross-point array structure may refer to a structure that is formed by arranging a plurality of lower electrodes (bit lines or word lines) and a plurality of upper electrodes (word lines or bit lines) to cross each other and to be coupled to memory cells MC including the data storage node SN and the access element AD. Here, the memory cells MC may be electrically coupled to a node where the lower electrodes and the upper electrodes are coupled to each other.

As such, each resistance variable memory cell MC may have a terminal that is coupled to one of the lower electrodes and another terminal that is coupled to one the upper electrodes. The resistance variable memory cell MC may be turned on when a level difference between voltages applied to both terminals thereof is larger than a preset level, and may be turned off when the level difference is smaller than the preset level.

The row selection unit 130 may select, based on a row address, a word line WL to be accessed among the plurality of word lines WL0 to WLm.

The column selection circuit 140 may select, based on a column address, a bit line BL to be accessed among the plurality of bit lines BL0 to BLn.

A memory cell MC may be accessed by electrically coupling a word line WL selected by the row selection circuit 130 to a bit line BL selected by the column selection circuit 140. The read circuit 150 may be coupled to the selected word line WL and the selected bit line BL through a global word line GWL and a global bit line GBL.

The read circuit 150 may read data from the memory cell array 120 in response to control signals provided by the controller 110.

In an embodiment, the read circuit 150 may drop a voltage at the word line WL to a first ground voltage VBB level at high speed for a first time period when the voltage level at the word line WL starts to drop after the memory cell MC becomes electrically connected to the word line WL according to a word line selection signal provided during a read operation. The read circuit 150 may boost up a voltage of the bit line BL to a power voltage VPP level at high speed for a second time period before the memory cell MC is coupled to the bit line BL according to a bit line selection signal after the voltage of the word line WL is dropped. In this example, the power voltage VPP level may be a pumping voltage level generated through a voltage pumping circuit (not illustrated) and the first ground voltage VBB level may be a negative voltage level.

As the voltage level of the word line WL and the voltage level of the bit line BL are controlled to reach target levels at high speed, the time required to turn on the memory cell MC may be shortened. Accordingly, the resistance variable memory apparatus 10 in accordance with an embodiment may perform the read operation at a faster speed and thus improve a read margin thereof.

Figure 2:
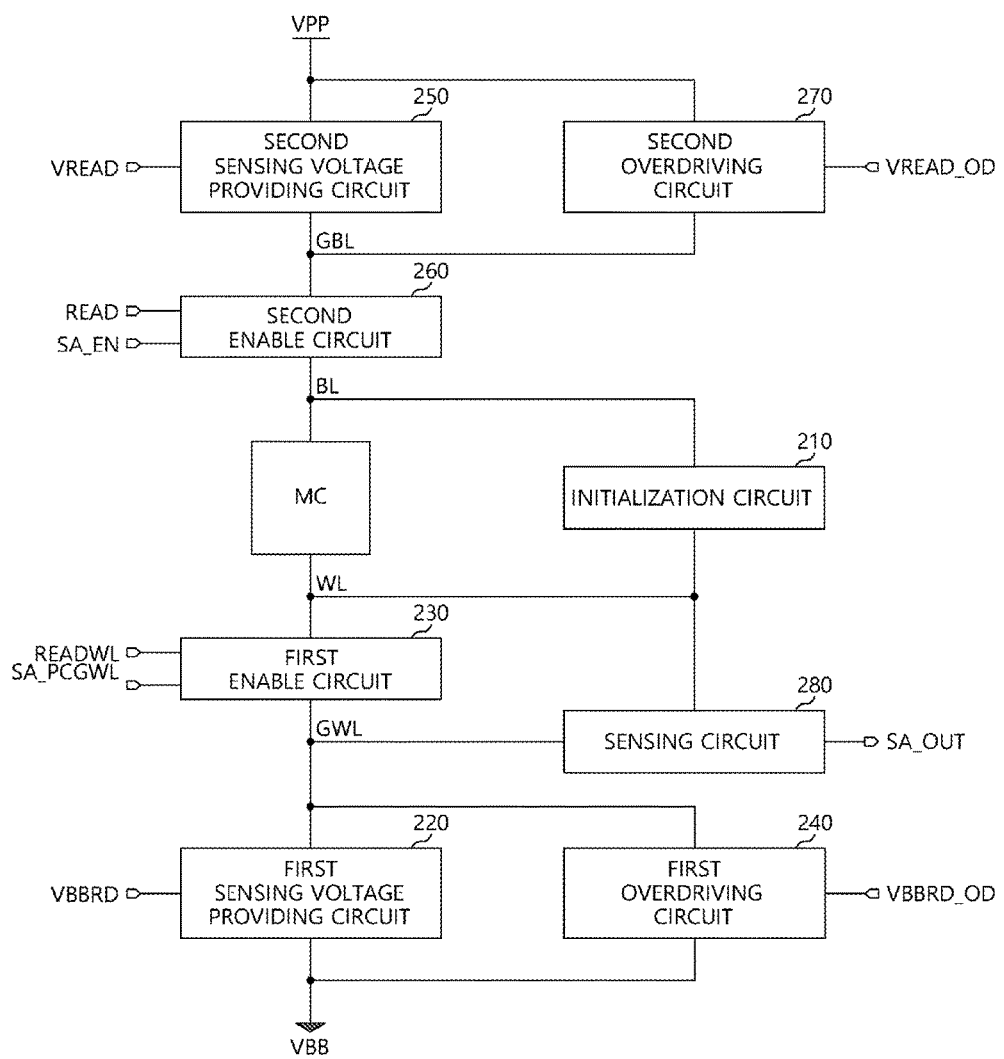
FIG. 2 is a configuration diagram illustrating an example of a read circuit according to an embodiment of the present disclosure.

FIG. 2 is a configuration diagram illustrating an example of a read circuit according to an embodiment.

Referring to FIG. 2, the read circuit 150 according to an embodiment may include an initialization circuit 210, a first sensing voltage providing circuit 220, a first enable circuit 230, a first overdriving circuit 240, a second sensing voltage providing circuit 250, a second enable circuit 260, a second overdriving circuit 270, and a sensing circuit 280.

The initialization circuit 210 may be coupled between two terminals (e.g., the bit line BL and the word line WL) of the memory cell MC. Before the read operation starts, the voltage between the terminals of the selected memory cell MC may have a preset voltage level (e.g., a second ground voltage VSS level). Here, the voltage between the terminals of the selected memory cell MC may be preset by the initialization circuit 210.

The first sensing voltage providing circuit 220 may be a voltage supply that provides a preset voltage level (e.g., a first read voltage VBBRD level) to the global word line GWL.

The first enable circuit 230 may provide the voltage applied to the global word line GWL to the word line WL in response to a word line selection signal READWL and a word line precharge signal SA_PCGWL.

The first overdriving circuit 240 may allow the voltage level of the global word line GWL to drop to a preset voltage level (e.g., the first ground voltage VBB level) at high speed in response to a first overdriving signal VBBRD_OD.

In an embodiment, the first overdriving signal VBBRD_OD may be enabled when the voltage level of the word line WL starts to drop to the first read voltage VBBRD level at high speed in response to the word line selection signal READWL and the word line precharge signal SA_PCGWL, and then may remain enabled for the preset first time period. The first overdriving signal VBBRD_OD may be provided, for example, from the controller 110.

The second sensing voltage providing circuit 250 may be a voltage supply that provides a voltage having a preset voltage level (e.g., a voltage having a second read voltage VREAD level) to the global bit line GBL.

The second enable circuit 260 may provide the voltage applied to the global bit line GBL to the bit line BL in response to a bit line selection signal READ and a sense amplifier enable signal SA_EN.

The second overdriving circuit 270 may boost up the voltage level of the global bit line GBL to a preset voltage level, for example, the power voltage VPP level at high speed in response to a second overdriving signal VREAD_OD.

In an embodiment, the second overdriving signal VREAD_OD may be enabled at a preset point in time after the voltage level of the word line WL is dropped at high speed through the first overdriving circuit 240, and then may remain enabled for the preset second time period until the second read voltage VREAD is applied to the bit line BL in response to the bit line selection signal READ and the sense amplifier enable signal SA_EN. The second overdriving signal VREAD_OD may be provided, for example, from the controller 110.

The sensing circuit 280 may generate sensing data SA_OUT by sensing an amount of current flowing through a selected memory cell MC after the selected memory cell MC is turned on by a voltage difference between the two terminals of the selected memory cell MC.

In an embodiment, the first ground voltage VBB may be a negative voltage and may have a lower level than the second ground voltage VSS.

The read operation on the memory cell MC may be performed after the memory cell is turned on when the potential difference between the two terminals of the memory cell MC becomes a specific level or more. In this example, the time required to turn on the selected memory cell MC may be shortened by rapidly dropping and boosting up the voltage levels of the word line WL and the bit line BL to which the selected memory cell MC is coupled. Accordingly, the read circuit 150 in accordance with an embodiment may perform the read operation at a faster speed and improve a read margin thereof, and thus may provide better performance for the resistance variable memory apparatus.

Figure 3:
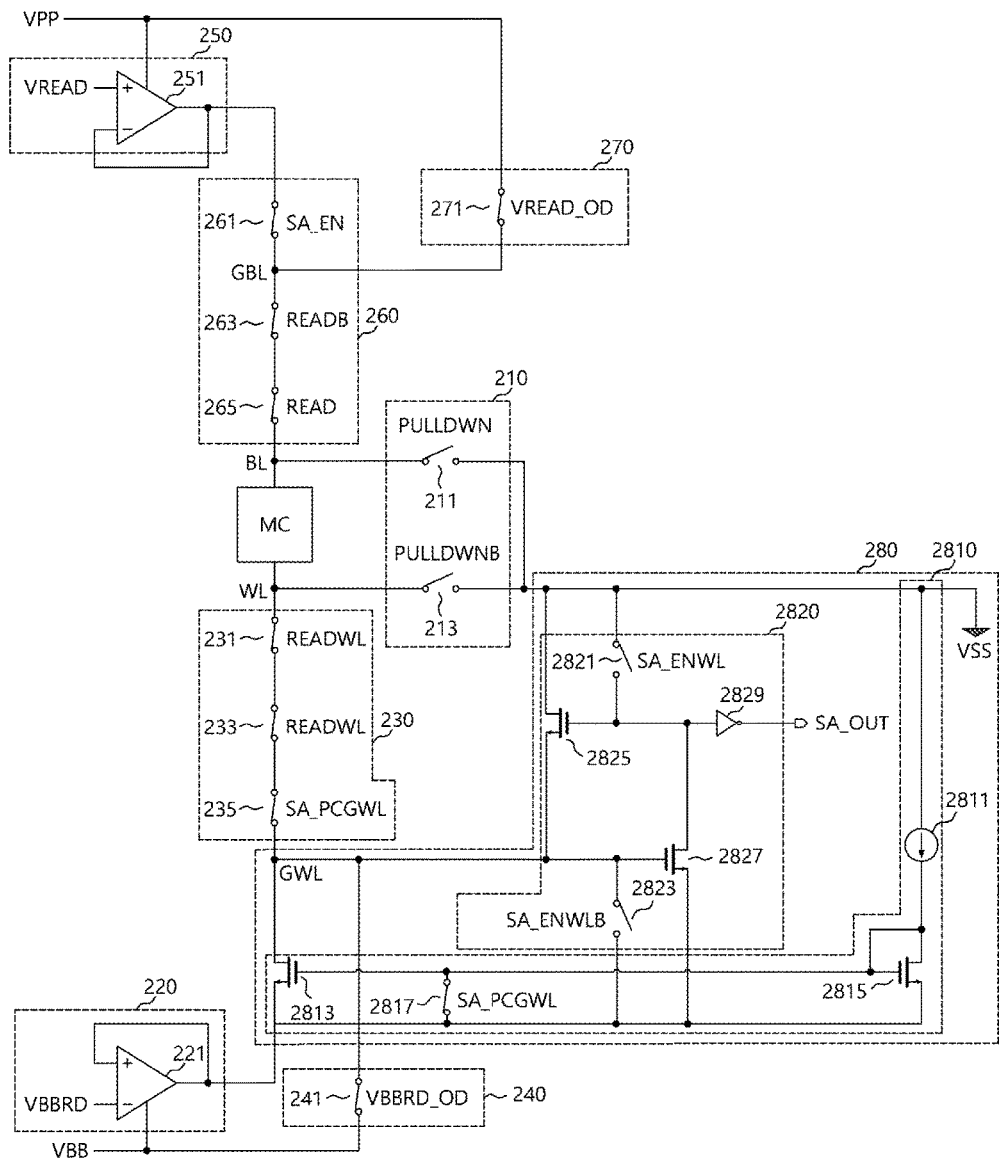
FIG. 3 is a circuit diagram illustrating an example of a read circuit according to an embodiment of the present disclosure.

FIG. 3 is a circuit diagram illustrating an example of a read circuit according to an embodiment.

Referring to FIG. 3, the initialization circuit 210 of a read circuit 150-1 according to an embodiment may include a first pull-down circuit 211 and a second pull-down circuit 213.

The first pull-down circuit 211 may set the voltage level of the bit line BL to the second ground voltage VSS level in response to an initialization signal PULLDWN. The second pull-down circuit 213 may set the voltage level of the word line WL to the second ground voltage VSS level in response to an inverted initialization signal PULLDWNB.

The voltage between both terminals of the memory cells MC may be maintained at the second ground voltage VSS level by the initialization circuit 210 before the read operation starts.

The first sensing voltage providing circuit 220 may include a first voltage source 221. The first voltage source 221 may be a voltage supply that provides the first read voltage VBBRD to the global word line GWL.

The first enable circuit 230 may include first to third switching elements coupled in series between the word line WL and the global word line GWL.

The first and second switching elements 231 and 233 may be driven in response to the word line selection signal READWL.

The third switching element 235 may be driven in response to the word line precharge signal SA_PCGWL, and may transfer the voltage applied to the global word line GWL to the word line WL through the first and second switching elements 231 and 233.

The first overdriving circuit 240 may include a switching element 241, which is driven in response to the first overdriving signal VBBRD_OD and is coupled between the global word line GWL and a supply terminal for the first ground voltage VBB. The driving of the first overdriving circuit 240 may decrease the voltage level of the global word line GWL, and may eventually decrease the voltage level of the word line WL to the level of the first ground voltage VBB at high speed.

The second sensing voltage providing circuit 250 may include a second voltage source 251.

The second voltage source 251 may be configured to supply the second read voltage VREAD.

The second enable circuit 260 may include first to third switching elements 261, 263, and 265.

The first switching element 261 may transfer the second read voltage VREAD provided from the second voltage source 251 to the global bit line GBL in response to the sense amplifier enable signal SA_EN.

The second switching element 263 may transfer the voltage applied to the global bit line GBL in response to an inverted bit line selection signal READB. The third switching element 265 may provide the voltage provided from the second switching element 263 to the bit line BL in response to the bit line selection signal READ.

The second overdriving circuit 270 may include a switching element 271, which is driven in response to the second overdriving signal VREAD_OD and is coupled between a supply terminal for the power voltage VPP and the global bit line GBL. The driving of the second overdriving circuit 270 may increase the voltage level of the global bit line GBL, and may eventually increase the voltage level of the bit line BL to the level of the power voltage VPP at high speed.

The sensing circuit 280 may include a current sinking circuit 2810 and an output circuit 2820.

The current sinking circuit 2810 may sink the current induced by the voltage across the word line WL serving as a sensing node.

In an embodiment, the current sinking circuit 2810 may include a current source 2811, a mirroring circuit 2813 and 2815, and a driving circuit 2817.

The current source 2811 may supply a reference current in the read operation.

The mirroring circuit 2813 and 2815 may "mirror" the reference current provided from the current source 2811 to a global word line GWL side.

The driving circuit 2817 may control whether or not to activate the current sinking circuit 2810. In an embodiment, the driving circuit 2817 may be a switching element driven in response to the word line precharge signal SA_PCGWL, but the present disclosure is not limited thereto.

The output circuit 2820 may sense data stored in the selected memory cell MC in response to the voltage level of the word line WL.

The output circuit 2820 may include a driving circuit 2821 and 2823, a current amount sensing circuit 2825 and 2827, and an amplification circuit 2829.

The driving circuit 2821 and 2823 may control whether or not to activate the output circuit 2820 in response to a sensing enable signal SA_ENWL and an inverted sensing enable signal SA_ENWLB.

The current amount sensing circuit 2825 and 2827 may sense an amount of current flowing through the memory cell MC based on the voltage levels applied to the word line WL and the global word line GWL.

The amplification circuit 2829 may generate the sensing data SA_OUT according to a sensing result of the current amount sensing circuit 2825 and 2827.

The read circuit 150-1 illustrated in FIG. 3 is merely an example, and any circuit that can perform overdriving on the word line WL and the bit line BL before the read operation is substantially performed and read the data contents of the memory cell MC through a current sensing method may be employed as the read circuit.

Figure 4:
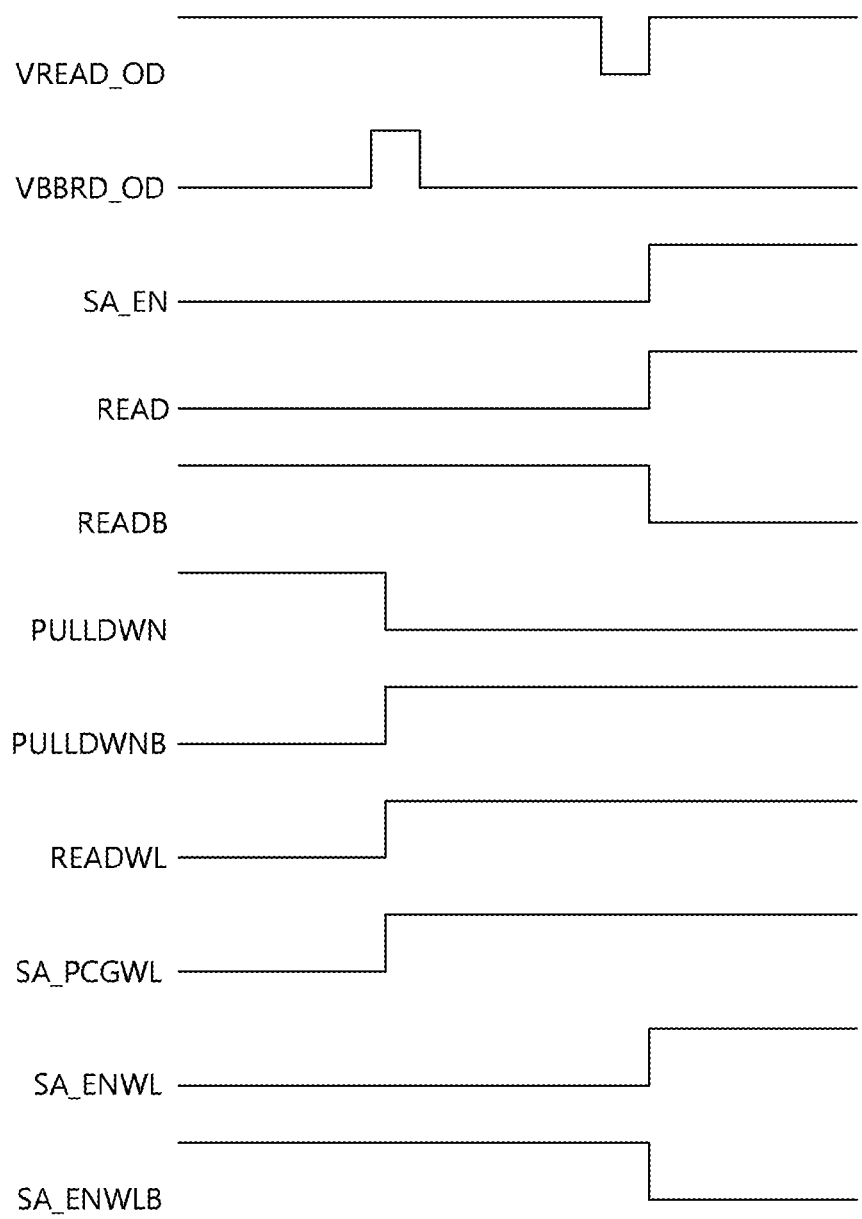
FIG. 4 is a timing diagram explaining an example of a read operation of a resistance variable memory apparatus according to an embodiment of the present disclosure.

FIG. 4 is a timing diagram illustrating an example of a read operation of a resistance variable memory apparatus according to an embodiment.

Before the read operation starts, the second ground voltage VSS may be applied to the word line WL and the bit line BL, which are terminals of the memory cell MC, by the initialization circuit 210 driven in response to the initialization signal PULLDWN and an inverted initialization signal PULLDWNB.

The word line selection signal READWL and the word line precharge signal SA_PCGWL may be applied together with the read command, and then the voltage level of the word line WL may start to drop to the first read voltage VBBRD level by the first enable circuit 230.

The first overdriving circuit 240 may be driven by the first overdriving signal VBBRD_OD at a point in time when the word line selection signal READWL and the word line precharge signal SA_PCGWL are enabled. Accordingly, the voltage level of the global word line GWL may drop, and eventually the voltage level of the word line WL may drop to the first ground voltage VBB level at high speed. The first overdriving signal VBBRD_OD may remain enabled for a preset time period. Accordingly, the voltage level of the word line WL may reach a target level, for example, the first read voltage VBBRD level at high speed.

Before the sense amplifier enable signal SA_EN is enabled, the second overdriving circuit 270 may be driven by enabling the second overdriving signal VREAD_OD for a preset time period. The voltage level of the global bit line GBL may increase, and eventually the voltage level of the bit line BL may increase to the second read voltage VREAD level at high speed. Accordingly, the potential difference between the two terminals of the memory cell MC may be equal to or greater than a preset level, and the memory cell MC may be turned on.

For example, after the second overdriving signal VREAD_OD is disabled, the bit line selection signal READ, the inverted bit line selection signal READB, and the sense amplifier enable signal SA_EN may be enabled. In another example, the second overdriving signal VREAD_OD may be disabled, and simultaneously the bit line selection signal READ, the inverted bit line signal READB, and the sense amplifier enable signal SA_EN may be enabled. Accordingly, data contents of the memory cell MC may be sensed through the sensing circuit 280.

In this example, the external power voltages VPP and VBB may be applied to the word line and the bit line for a preset time period to induce the potential difference between the bit line and the word line at high speed in the read operation.

Accordingly, the voltage levels of the bit line and the word line may reach the target levels at high speed, and thus it is possible to perform the read operation at a faster speed and to improve the read margin.

The operation characteristics in the resistance variable memory apparatus 10 may vary depending on temperature. The read condition of the resistance variable memory apparatus 10 may vary depending on the temperature and will be described below.

Figure 5:
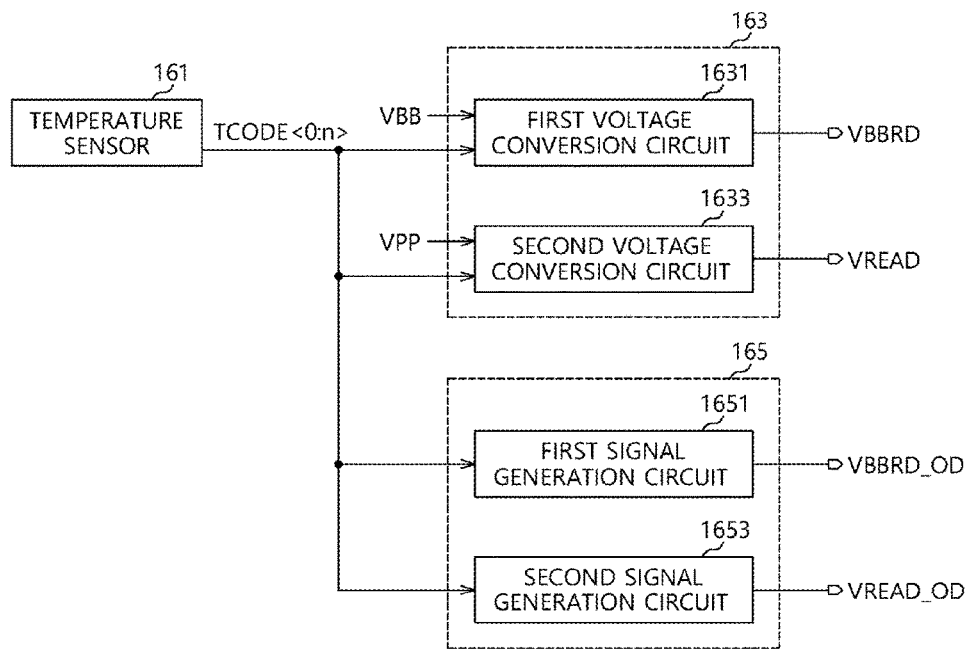
FIG. 5 is a configuration diagram illustrating an example of a temperature-based control circuit according to an embodiment of the present disclosure.

FIG. 5 is a configuration diagram illustrating an example of a temperature-based control circuit according to an embodiment.

A temperature-based control circuit 160 illustrated in FIG. 5 may be included, for example, in the resistance variable memory apparatus 10 illustrated in FIG. 1.

The temperature-based control circuit 160 may include a temperature sensor 161, a voltage conversion circuit 163, and a signal generation circuit 165.

The temperature sensor 161 may output a plural-bit temperature code TCODE<0:n> by detecting an operation temperature of the resistance variable memory apparatus 10. In an embodiment, the temperature sensor 161 may be installed inside or outside the resistance variable memory apparatus 10.

The voltage conversion circuit 163 may generate the first read voltage VBBRD and the second read voltage VREAD in response to the temperature code TCODE<0:n>.

The voltage conversion circuit 163 may include a first voltage conversion circuit 1631 and a second voltage conversion circuit 1633. The first voltage conversion circuit 1631 may receive the first ground voltage VBB and generate the first read voltage VBBRD based on the temperature code TCODE<0:n>. The second voltage conversion circuit 1633 may receive the power voltage VPP and generate the second read voltage VREAD based on the temperature code TCODE<0:n>.

The first read voltage VBBRD and the second read voltage VREAD generated in the voltage conversion circuit 163 may be provided to the read circuits 150 and 150-1 illustrated in FIGS. 2 and 3.

The signal generation circuit 165 may generate the first overdriving signal VBBRD_OD and the second overdriving signal VREAD_OD in response to the temperature code TCODE<0:n>.

The signal generation circuit 165 may include a first signal generation circuit 1651, which generates the first overdriving signal VBBRD_OD based on the temperature code TCODE<0:n>, and a second signal generation circuit 1653, which generates the second overdriving signal VREAD_OD based on the temperature code TCODE<0:n>.

Enable maintenance times, for example, enable periods of the first and second overdriving signals VBBRD_OD and VREAD_OD may be determined based on the temperature code TCODE<0:n>.

Accordingly, as the read voltages VBBRD and VREAD are adaptively changed according to change in the surrounding temperature in the resistance variable memory apparatus 10 according to the embodiment, the overdriving times for the word line and the bit line may also be changed in proportional to the read voltages VBBRD and VREAD.

FIGS. 6 to 10 are configuration diagrams illustrating examples of an electronic apparatus according to various embodiments.

Figure 6:
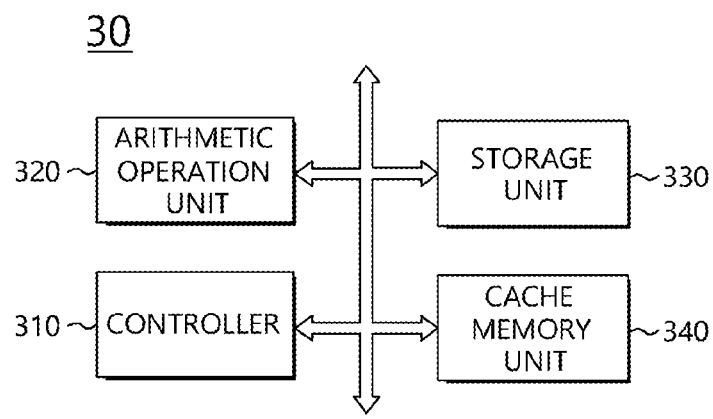
FIGS. 6 to 10 are configuration diagrams illustrating examples of electronic apparatuses according to embodiments of the present disclosure.

FIG. 6 is a configuration diagram illustrating an example of a processor as an electronic apparatus according to an embodiment.

Referring to FIG. 6, a processor 30 may include a controller 310, an arithmetic operation unit 320, a storage unit 330, and a cache memory unit 340.

The controller 310 may control an overall operation of the processor 30. For example, the controller 310 may receive a signal such as a command and/or data from an external apparatus, and may decode the command and perform input, output, or processing on data.

The arithmetic operation unit 320 may perform several arithmetic operations according to a decoding result of the command in the controller 310. The arithmetic operation unit 320 may include at least one arithmetic and logic unit (ALU), but the present disclosure is not limited thereto.

The storage unit 330 may serve as a register, and may store data in the processor 30. The storage unit 330 may include a data register, an address register, a floating-point register, and other various registers. The storage unit 330 may store addresses in which data operated in the arithmetic operation unit 320, data according to an operation result, and data to be processed in the arithmetic operation unit 320 are stored.

The storage unit 330 may include a resistance variable memory apparatus, and, for example, the storage unit 330 may have the same configuration as the resistance variable memory apparatus as illustrated in FIG. 1. Accordingly, the storage unit 330 may set voltages of a word line and a bit line at high speed in a read operation before a read operation starts.

The cache memory unit 340 may serve as a temporary storage space.

The processor 30 illustrated in FIG. 6 may be a central processing unit (CPU) of an electronic apparatus, a graphic processing unit (GPU), a digital signal processor (DSP), an application processor (AP), and the like.

Figure 7:
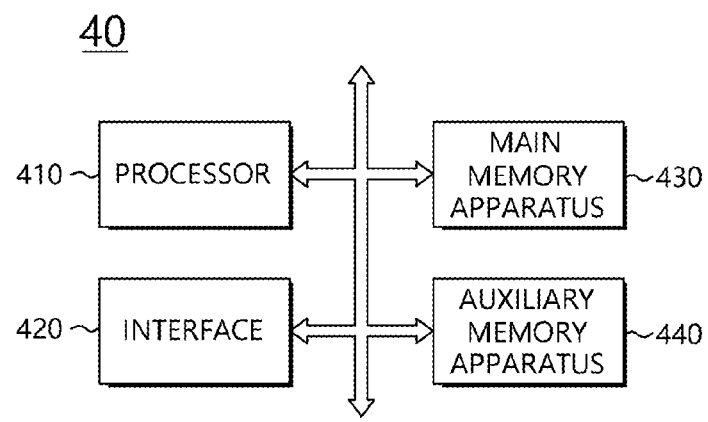
Figure 8:
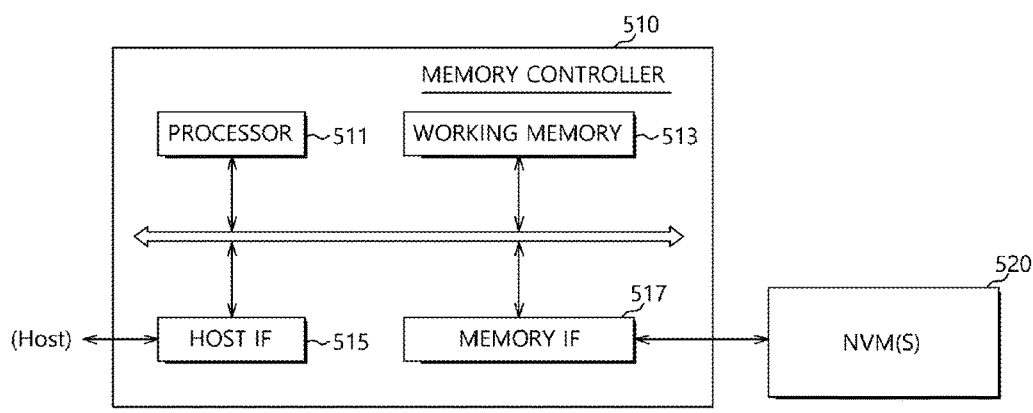

FIGS. 7 and 8 are configuration diagrams illustrating examples of a data processing system as an electronic apparatus according to various embodiments of the present technical spirit.

A data processing system 40 illustrated in FIG. 7 may include a processor 410, an interface 420, a main memory apparatus 430, and an auxiliary memory apparatus 440.

The data processing system 40 may perform input, processing, output, communication, storage, and the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation system, a video camera, a tape recorder, a telematics device, an audio/video (AV) system, or a smart television (TV).

In an embodiment, the data processing system 40 may be a data storage apparatus. The data processing system 40 may be a disc type apparatus such as a hard disc, an optical drive, a solid state disc, or a digital versatile disc (DVD) or a card type apparatus such as a universal serial bus (USB) memory, a secure digital (SD) card, a memory stick, a smart media card, internal/external multimedia cards, or a compact flash card.

The processor 410 may control data exchange between the main memory apparatus 430 and an external apparatus through the interface 420, and the processor 410 may control an overall operation such as decoding of commands input from the external apparatus through the interface 420 and an operation or comparison of data stored in the system.

The interface 420 may provide an environment that a command and data are exchangeable between the external apparatus and the data processing system 40. The interface 420 may be a man-machine interface apparatus which includes an input apparatus (for example, a keyboard, a keypad, a mouse, a voice recognition apparatus, and the like) and an output apparatus (for example, a display, a speaker, and the like) or a card interface apparatus or a disc interface apparatus (for example, Integrated Drive Electronics (IDE), Small Computer System Interface (SCSI), Serial Advanced Technology Attachment (SATA), External SATA (eSATA), Personal Computer Memory Card International Association (PCMCIA), and the like) according to an application environment of the data processing system 40.

The main memory apparatus 430 may store an application, a control signal, data, and the like required for an operation of the data processing system 40, and may serve as a storage space that may transfer and execute program or data from the auxiliary storage apparatus 440. The main memory apparatus 430 may be implemented using a nonvolatile memory apparatus.

The auxiliary memory apparatus 440 may be a space for storage of a program code, data, and the like, and may be a high-capacity memory apparatus. For example, the auxiliary memory apparatus 440 may be implemented using a nonvolatile memory apparatus.

The main memory apparatus 430 and the auxiliary memory apparatus 440 may be configured of a resistance variable memory apparatus, and for example, the main memory apparatus 430 and the auxiliary memory apparatus 440 may have the same configuration as the resistance variable memory apparatus as illustrated in FIG. 1. Accordingly, the main memory apparatus 430 and the auxiliary memory apparatus 440 may set voltages of a word line and a bit line at high speed in a read operation before a read operation starts.

A data processing system 50 illustrated in FIG. 8 may include a memory controller 510 and a nonvolatile memory apparatus 520.

The memory controller 510 may access the nonvolatile memory apparatus 520 in response to a request from a host. The memory controller 510 may include a processor 511, a working memory 513, a host interface 515, and a memory interface 517.

The process 511 may control an overall operation of the memory controller 510. The working memory 513 may store an application, data, a control signal, and the like required for the operation of the memory controller 510.

The host interface 515 may perform protocol conversion for exchange of data and a control signal between the host and the memory controller 510, and the memory interface 517 may perform protocol conversion for exchange of data and a control signal between the memory controller 510 and the nonvolatile memory apparatus 520.

In an embodiment, the nonvolatile memory apparatus 520 and/or the working memory 513 may be configured of a resistance variable memory apparatus, and for example, the nonvolatile memory apparatus 520 and/or the working memory 513 may have the same configuration as the resistance variable memory apparatus as illustrated in FIG. 1. Accordingly, the nonvolatile memory apparatus 520 and/or the working memory 513 may set voltages of a word line and a bit line at high speed in a read operation before a read operation starts.

The data processing system 50 illustrated in FIG. 8 may be used as a disc apparatus or internal/external memory cards of a portable electronic apparatus. The data processing system 50 may be used as an image processor and other application chipsets FIGS. 9 and 10 are configuration diagrams illustrating other examples of an electronic apparatus according to various embodiments of the present technical spirit.

Figure 9:
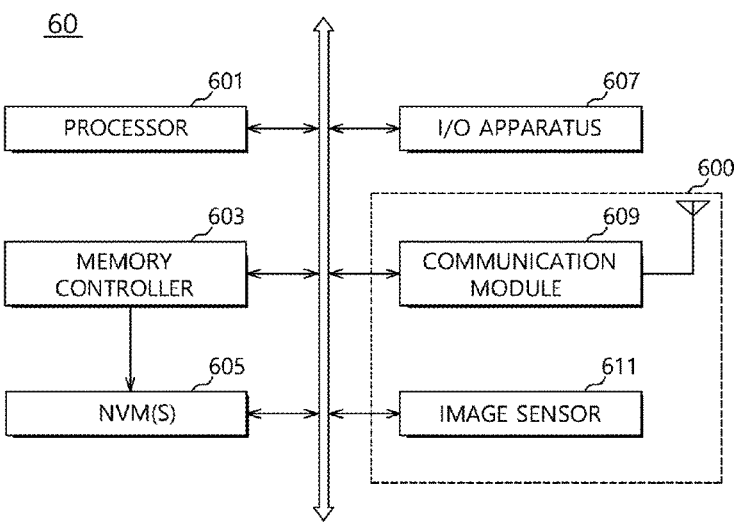
Figure 10:
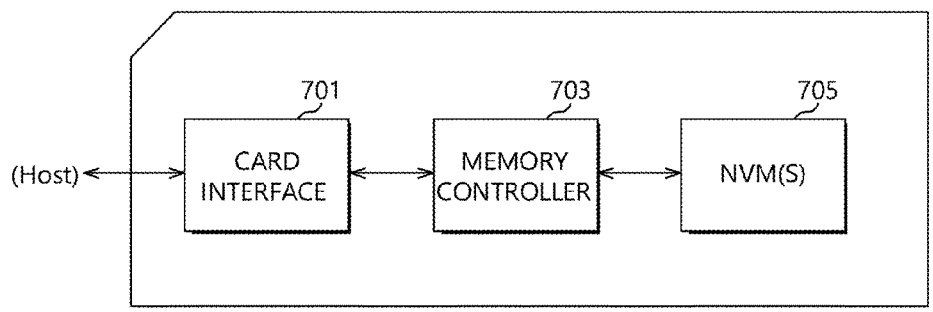

An electronic apparatus 60 illustrated in FIG. 9 may include a processor 601, a memory controller 603, a nonvolatile memory apparatus 605, an input/output (I/O) apparatus 607, and a function module 600.

The memory controller 603 may control a data processing operation, for example, a write operation, a read operation, and the like of the nonvolatile memory apparatus 605 according to control of the processor 601.

Data written in the nonvolatile memory apparatus 605 may be output through the I/O apparatus 607 according to control of the processor 601 and the memory controller 603. For example, the I/O apparatus 607 may include a display apparatus, a speaker apparatus, and the like.

In an embodiment, the nonvolatile memory apparatus 605 may include a resistance variable memory apparatus, and for example, the nonvolatile memory apparatus 605 may have the same configuration as the resistance variable memory apparatus as illustrated in FIG. 1. Accordingly, the nonvolatile memory apparatus 605 may set voltages of a word line and a bit line at high speed in a read operation before a substantial read operation starts.

The I/O apparatus 607 may also include an input apparatus, and the I/O apparatus 607 may input a control signal for controlling an operation of the processor 601 or data to be processed in the processor 601 through the input apparatus.

In an embodiment, the memory controller 603 may be implemented with a portion of the processor 601 or a separate chipset from the processor 601.

The function module 600 may be a module that may perform a function selected according to an application example of the electronic apparatus 60 illustrated in FIG. 9, and a communication module 609 and an image sensor 611 as an example of the function module 600 are illustrated in FIG. 9.

The communication module 609 may provide a communication environment that the electronic apparatus 60 is coupled to a wired or wireless communication network to exchange data and a control signal.

The image sensor 611 may convert an optical image to digital image signals and transfer the digital image signals to the processor 601 and the memory controller 603.

When the function module 600 includes the communication module 609, the electronic apparatus 60 of FIG. 9 may be a portable communication apparatus such as a wireless communication terminal. When the function module 600 may include the image sensor 611, the electronic apparatus 60 may be a digital camera, a digital camcorder, or an electronic apparatus (e.g., a personal computer [PC], a laptop computer, a mobile communication terminal, and the like) to which any one of the digital camera and the digital camcorder is attached.

The electronic apparatus 60 may also include both the communication module 609 and the image sensor 611.

An electronic apparatus 70 illustrated in FIG. 10 may include a card interface 701, a memory controller 703, and a nonvolatile memory apparatus 705.

FIG. 10 is an illustrative diagram illustrating the electronic apparatus 70 used as a memory card or a smart card, and the electronic apparatus 70 illustrated in FIG. 10 may be one of a PC card, a multimedia card, an embedded multimedia card, a secure digital card, and a universal serial bus (USB) drive.

The card interface 701 may perform interacting on data exchange between a host and the memory controller 703 according to a protocol of the host. In an embodiment, the card interface 701 may refer to hardware that may support a protocol used in the host, software installed in the hardware supporting the protocol used in the host, or a signal transmission method.

The memory controller 703 may control data exchange between the nonvolatile memory apparatus 705 and the card interface 701.

The nonvolatile memory apparatus 705 may include a resistance variable memory apparatus, and for example, the nonvolatile memory apparatus 705 may have the same configuration as the resistance variable memory apparatus as illustrated in FIG. 1. Accordingly, the nonvolatile memory apparatus 705 may set voltages of a word line and a bit line at high speed in a read operation before a read operation starts.

The above described embodiments of the present invention is are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A resistance variable memory apparatus comprising:
   a memory cell array including a plurality of resistance variable memory cells coupled between a plurality of word lines and a plurality of bit lines; and
   a read circuit configured to couple a word line, to which a selected resistance variable memory cell is coupled, to a first ground voltage supply terminal for a preset first time period before an amount of current flowing through the selected resistance variable memory cell is detected, the read circuit coupling a bit line, to which the selected resistance variable memory cell is coupled, to a power voltage supply terminal for a preset second time period, in a read operation.

2. The resistance variable memory apparatus of claim 1, wherein the read circuit includes a first overdriving circuit configured to couple the word line to the first ground voltage supply terminal for the first time period in response to a word line selection signal provided in the read operation when the selected resistance variable memory cell is coupled to the word line.

3. The resistance variable memory apparatus of claim 2, wherein the read circuit is configured to include a second overdriving circuit configured to couple the bit line to the power voltage supply terminal for the second time period in response to a bit line selection signal provided in the read operation before the selected resistance variable memory cell is coupled to the bit line.

4. The resistance variable memory apparatus of claim 1, wherein the read circuit is configured to sense an amount of current flowing through the selected resistance variable memory cell after the selected resistance variable memory cell is turned on by applying a first read voltage to the word line and applying a second read voltage to the bit line.

5. The resistance variable memory apparatus of claim 1, wherein the first ground voltage has a negative voltage level.

6. The resistance variable memory apparatus of claim 1, wherein the power voltage has a pumping voltage level.

7. The resistance variable memory apparatus of claim 1, further comprising:
   a temperature sensor configured to generate a temperature code based on an operation temperature of the resistance variable memory apparatus;

a voltage conversion circuit configured to generate a read voltage based on the temperature code; and a signal generation circuit configured to generate a first overdriving signal enabled for the first time period determined based on the temperature code and a second overdriving signal enabled for the second time period determined based on the temperature code.

8. A read circuit for a resistance variable memory apparatus comprising:

a read unit configured to couple a word line, to which a selected resistance variable memory cell is coupled, to a first ground voltage supply terminal for a preset first time period before an amount of current flowing through the selected resistance variable memory cell is detected, the read unit coupling a bit line, to which the selected resistance variable memory cell is coupled, to a power voltage supply terminal for a preset second time period, in a read operation.

9. The read circuit of claim 8, wherein the read unit includes a first overdriving circuit configured to couple the word line to the first ground voltage supply terminal for the first time period in response to a word line selection signal provided in the read operation when the selected resistance variable memory cell is coupled to the word line.

10. The read circuit of claim 9, wherein the read unit is configured to include a second overdriving circuit configured to couple the bit line to the power voltage supply terminal for the second time period in response to a bit line selection signal provided in the read operation before the selected resistance variable memory cell is coupled to the bit line.

11. The read circuit of claim 8, wherein the read unit is configured to sense an amount of current flowing through the selected resistance variable memory cell after the selected resistance variable memory cell is turned on by applying a first read voltage to the word line and applying a second read voltage to the bit line.

12. The read circuit of claim 8, wherein the first ground voltage has a negative voltage level.

13. The read circuit of claim 8, wherein the power voltage has a pumping voltage level.

14. The read circuit of claim 8, wherein the first time period and the second time period are set based on an operation temperature of the resistance variable memory apparatus.

15. A read method for a resistance variable memory apparatus, the method comprising:

coupling a word line, to which a selected resistance variable memory cell is coupled, to a first ground voltage supply terminal for a preset first time period in response to a read command;

coupling a bit line, to which the selected resistance variable memory cell is coupled, to a power voltage supply terminal for a preset second time period; and detecting an amount of current flowing through the selected resistance variable memory cell.

16. The method of claim 15, wherein the coupling of the word line to the first ground voltage supply terminal includes coupling the word line to the first ground voltage supply terminal for the preset first time period in response to a word line selection signal when the selected resistance variable memory cell is coupled to the word line.

17. The method of claim 15, wherein the coupling of the bit line to the power voltage supply terminal includes coupling the bit line to the power voltage supply terminal for the preset second time period in response to a bit line selection signal before the selected resistance variable memory cell is coupled to the bit line.

18. The method of 15, wherein the first ground voltage has a negative voltage level.

19. The method of claim 15, wherein the power voltage has a pumping voltage level.

20. The method of claim 15, wherein the first time period and the second time period are set based on an operation temperature of the resistance variable memory apparatus.

* * * * *